United States Patent [19]
Golecki et al.

[11] Patent Number: 5,747,096
[45] Date of Patent: May 5, 1998

[54] METHOD FOR MEASURING THE DEPOSITIONS, DENSIFICATION OF ETCHING RATE OF AN ELECTRICALLY CONDUCTIVE BODY

[75] Inventors: Ilan Golecki, Morris; Dave Narasimham, Hunterdon, both of N.J.

[73] Assignee: AlliedSignal Inc., Morris Township, N.J.

[21] Appl. No.: 805,794

[22] Filed: Feb. 25, 1997

Related U.S. Application Data

[63] Continuation of Ser. No. 359,172, Dec. 19, 1994, abandoned.

[51] Int. Cl.$^6$ ................................................. C23C 16/26
[52] U.S. Cl. ................... 427/8; 427/10; 427/226; 427/228; 427/249; 427/543; 427/590; 427/591; 427/595
[58] Field of Search ......................... 427/8, 10, 226, 427/228, 249, 543, 590, 591, 595; 324/234, 236; 216/61, 86; 156/627.1

[56] References Cited

U.S. PATENT DOCUMENTS

| | | | |
|---|---|---|---|
| 4,472,454 | 9/1984 | Houdayer et al. | 427/45.1 |
| 4,543,576 | 9/1985 | Hieber et al. | 340/870.17 |
| 4,717,582 | 1/1988 | Kotoye et al. | 427/8 |
| 4,793,895 | 12/1988 | Kaanta et al. | 156/627 |
| 5,013,130 | 5/1991 | Atkins et al. | 350/96.3 |
| 5,348,774 | 9/1994 | Golecki et al. | 427/543 |

OTHER PUBLICATIONS

Kotlensky, "A Review of CVD Carbon Infiltration Of Porous Substrates", Proc. 16th Nat. Symposium Of The Soc. Of Aerospace, Mat. & Proc. Eng., Apr. 1971, pp. 257–265.

Lieberman et al., "CVD/PAN Felt Carbon/Carbon Composites" Composite Material, vol. 9, Oct. 1975 p. 337.

Lieberman & Noles, "Gas Analysis During The Chemical Vapor Deposition Of Carbon" Proc. 4th Int. Conf. on Chem. Vapor Dep. Boston, Mass, Oct. 1973, pp. 19–29.

Stoller et al, Carbon Fiber Reinforced–Carbon Matrix Composites:, Proc. 1971 Fall Meet. of the Met. Soc. if AIME, Detroit, Mich., Met. Soc. of AIME, 1974, pp. 69–136 (month not available).

Bristow & Hill, "The Development Of A Plant For The Production Of Carbon/Carbon Composites...", Inst. Chem. Engl, London, England, Symp. Ser. 43, 1975, pp. 5–5 through 5–11 (month not available).

*Primary Examiner*—Shrive Beck
*Assistant Examiner*—Timothy Meeks
*Attorney, Agent, or Firm*—Verne E. Kreger, Jr.

[57] ABSTRACT

A method for determining the instantaneous and cumulative mass rate of change of a conductive body in a deposition, densification or etching process through the use of a gaseous, liquid or particulate solids precursor. In one application, porous solid structures are densified by thermally decomposing a gaseous precursor to deposit an electrically and thermally conductive deposit within the structure. The rate of densification is determined by measuring the change of the electrical conductivity of the structure over time as the structure increases in mass.

10 Claims, 4 Drawing Sheets

METHOD FOR MEASURING THE DEPOSITIONS, DENSIFICATION OF ETCHING RATE OF AN ELECTRICALLY CONDUCTIVE BODY

This application is a continuation of application Ser. No. 08/359,172 filed Dec. 19, 1994, now abandoned.

FIELD OF THE INVENTION

This invention relates generally to the field of deposition, densification or etching of an electrically conductive body, and in particular an in-situ method for measuring the rate of chemical vapor deposition and inflitration, densification or etching of a conductive body.

BACKGROUND OF THE INVENTION

The in-situ, real-time measurement of the deposition rate of coatings or the densification rate of a porous body or the etching rate of a body is important from both the practical and scientific points of view. In the course of developing new materials and new deposition, densification or etching processes, as well as during routine production runs, it is important to determine the rate of change in the mass of body. It is time-effective to be able to determine rate of mass increase or decrease during the process, rather than after the process so as to allow adjustments to the process conditions and also to terminate the process when the body has reached its new configuration.

A specific application for chemically altering the mass of a body is densification of a porous body. An exemplary method of densifying a porous body is disclosed in U.S. Pat. No. 5,348,774 to Golecki et al. assigned to the same assignee as the present application and incorporated herein by reference. Composite materials, such as carbon-carbon, offer advantages of light weight and good mechanical and thermal properties for a variety of aerospace and other applications, such as brake pads and uncooled engine and other aircraft parts. One of the most common fabrication methods of such composite structures involves densification by means of chemical vapor deposition (CVD) and infiltration (CVI). This method involves flowing a stream of vapor containing the desired element or compound over and around the part to be densified, while the part is kept at a temperature sufficient to decompose the precursor vapor. Under the appropriate conditions, the precursor decomposes in such a way as to produce the desired element or compound within the pores of the part, thus increasing its density.

In summary, porous carbon-carbon annular disks, or preforms, are placed inside a water-cooled copper coil in a vacuum chamber, as shown in FIG. 1. The coil is energized by means of an ac power supply at a frequency in the range 2–10 kHz, resulting in an alternating current flowing on the surface of the coil and to some depth in the copper. This alternating current produces a time-varying magnetic field in the volume inside the coil, which results in a time-varying current flowing in the electrically conducting disks. The induced current flowing in the disks heats the disks by Joule heating to temperatures in a typical range of 800°–1400° C. The heated disks are exposed to a vapor flow of a compound containing carbon, such as cyclopentane, $C_5H_{10}$. A fraction of this chemical compound decomposes inside and on the surfaces of the pores and voids present in the disks, resulting in the deposition of carbon. This deposition of carbon inside the disks results in an increase in the mass, weight, density and electrical conductivity of the disks.

One particular problem in any densification process is determining when the densification is complete. Stopping the process to check the rate of densification and percent completion disrupts and adds time to the overall process. Time measurements and trial and error techniques are inaccurate and also add time to the process. Allowing the process to continue past the desired density of the parts may result in undesirable effects such as surface crusting and surface deposition necessitating in extra machining of the parts. Continuing the process beyond the optimum densification point also results in the formation of excessive amounts of by-products, such as liquid tar and gas-phase nucleated compounds. Golecki et al. disclose an in-situ weighing device (e.g. an electronic balance) that continuously monitors the weight of the disks during the densification run. The balance allows a determination of the end-point of the infiltration process, by monitoring the change in slope of the weight gain as a function of time. The slope will decrease when all the open pores in the disks have been filled. The drawback with this method is that the scale adds expense to the process and must be maintained in an environmentally-controlled chamber so that the scale is not exposed to the process environment which would adversely affect the operation of the scale An example of an in-situ method for measuring the deposition rate of coatings on a substrate formed from the vapor phase is the quartz oscillator. The oscillator is located near the substrate and measures the change in resonant frequency as a film is deposited on both the substrate and oscillator. As the film is deposited on the oscillator, its mass increases and its resonant frequency changes. This technique requires a line-of-sight deposition method, such as physical evaporation or sputtering in high vacuum, between the source of deposited material and the quartz crystal. This technique cannot be used if the substrate needs to be heated in order for deposition to occur, as in chemical vapor deposition and infiltration, because it is difficult to maintain the quartz crystal at the required same temperature as the substrate, and the oscillation frequency of the crystal is sensitive to temperature.

A technique which can be used in processes where the substrate is at elevated temperatures and in non-vacuum conditions is laser reflectometry. In this approach, a light beam from a laser or other appropriate source is directed onto the surface of the substrate and the intensity of the reflected beam is measured as a function of time. Different refractive indices exist between the substrate, film and the surrounding vapor causing interference fringes that allow the film thickness and growth rate to be determined provided the optical constants of the film and substrate are known. This method only works in practice for films transparent to the wavelength of the light used and requires direct line of sight of the substrate surface.

SUMMARY OF THE INVENTION

The present invention provides a method for determining the instantaneous and cumulative mass rate of change of an electrically conductive body in a deposition, densification or etching process through the use of a gaseous, liquid or particulate solids precursor.

In one application, the present invention provides a method for determining the instantaneous and cumulative rate of densification of a porous solid structure during infiltration with a compound which upon thermal decomposition forms a conducting solid residue by measuring the value of the electrical conductivity of the porous structure as a function of time and continuing the densification process until the slope of the measured electrical conductivity as a function of time reaches a desired value, which could be associated with a slope breakpoint or threshold value thereby indicating the end point of the densification process. The electrical conductivity may be measured by determining the value of the current in or voltage across the coil which inductively heats the porous structures. This invention requires that the solid residue formed inside the porous structure during CVI be sufficiently electrically conducting at the densification temperature to couple to the coil and thereby affect the measured current or voltage. The specific end point of the densification process is dependent upon the specifics of the process and the material of the porous structure.

DETAILED DESCRIPTION OF THE PREFERRED EMBODIMENTS

This invention can be used for measuring the rate of densification, deposition or etching of metals, semiconductors or insulators and is only limited by the accuracy of the measurement of the electrical conductivity of the substrate. It does not require line of sight access to the substrate, heater or source of material which is being deposited and can be used in a wide range of process conditions. By way of example only, the invention will be described as it applies to a method for densifying a porous structure, and is not intended to limit the scope of the application of the invention.

The invention provides for an improved method and apparatus for rapidly densifying a porous structure and in particular an improved method for determining both the instantaneous and total or cumulative densification rate of porous bodies, such as carbon-carbon composites, during densification by chemical vapor infiltration. The method further determines the optimum stopping point of the densification process.

Figure 1:
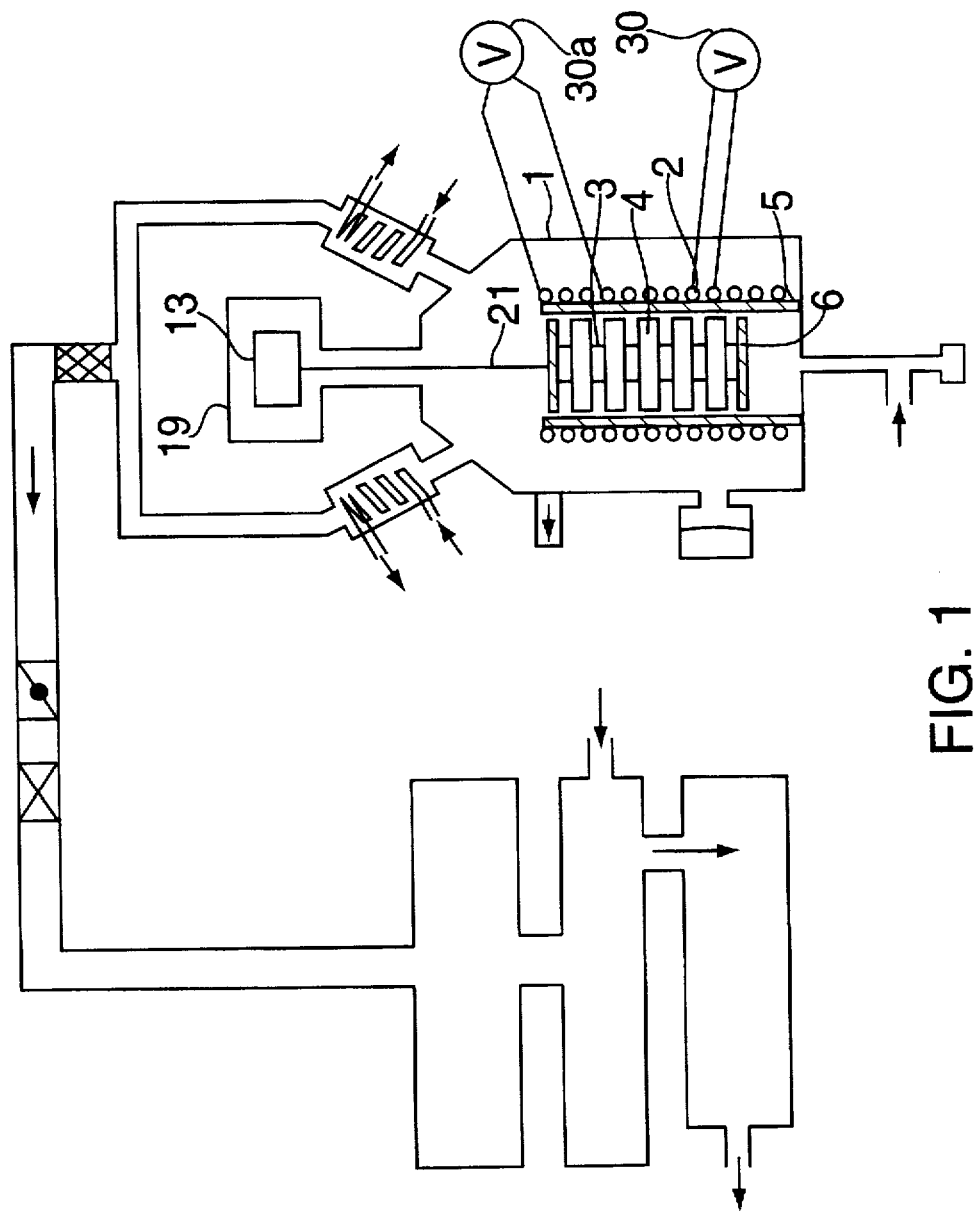
FIG. 1 is a schematic cross-sectional view of a chemical vapor infiltration vessel with associated auxiliaries suitable for the practice of this invention.

Referring to FIG. 1, the invention takes advantage of the observed direct correlation between current or voltage in the coil 2 and the rate of densification. The method is non-invasive, such that weighing device 13 and chamber 19 may be eliminated from the densification process. That is, the measured coil current and voltage decrease with time as substrate 4 becomes more electrically conductive and more dense with time. An increase in the electrical conductivity of substrate 4 occurs because the deposited carbon is electrically conducting and provides additional conduction paths for the current flowing in substrate 4. The increase in electrical conductivity causes improved electromagnetic coupling between substrate 4 and coil 2.

The apparatus employed and the operation procedures involved in the densification process and measuring the rate of densification may be generally described as follows:

Preferred apparatus is illustrated in FIG. 1. Porous carbon-carbon preform disks 4 are heated by induction inside a helical, water-cooled copper coil 2. The coil is energized with a Pillar (Mark 6) audio-frequency power supply, which can deliver up to 30 kW at 220 V and 10 kHz maximum. The preforms are made of non-woven PAN carbon fibers and have an initial density in the range of 0.4–0.6 g/cm$^3$. Multiple disks can be infiltrated simultaneously; the results described herein were obtained with three disks per run. The disks 4 are place around a molybdenum or alumina ($Al_2O_3$) mandrel 3 and spaced about 1 cm apart. The disks 4 are held by friction or on three mm diameter alumina rods inserted through the mandrel. An electrically conductive mandrel is not required since the electrical conductivity of these preforms is sufficiently high to couple directly to the electromagnetic field. Other, less conductive materials to be densified may require an electrically conductive mandrel. The mandrel 3 and disks 4 are hung from the top of the chamber 1 via six mm graphite rods 21 and an alumina coupler. In order to reduce radiative heat losses from the outer surfaces of the top and bottom disks, several radially slotted and continuous grafoil plates 6 are placed on the top and below the bottom surfaces of the mandrel. A quartz tube 5 may be inserted between the disks and the coil in order to act as a flow channeler for the cyclopentane. Alternatively, a much shorter quartz tube 5 may be placed between the bottom of the chamber and the coil so that the outer diameter surfaces of the disks are in direct viewing relationship with the coil. The temperatures of the disks are measured directly with type R, Pt-13% Rh/Pt thermocouples inserted at different locations half-way through the thickness of the disks. Pyrometry measurements are performed in the 0.8–1.1 μm wavelength ranges through a sapphire window. The overall densification rate is determined by measuring the current flowing in the coil or voltage across the coil. Throughout various densification runs, power is controlled within the range of 8.8–13.2 kW, the frequency is controlled from 4.9–8.6 kHz, total pressure from 20–100 Torr and the cyclopentane flow rate is controlled from 170–540 sccm.

Figure 2:
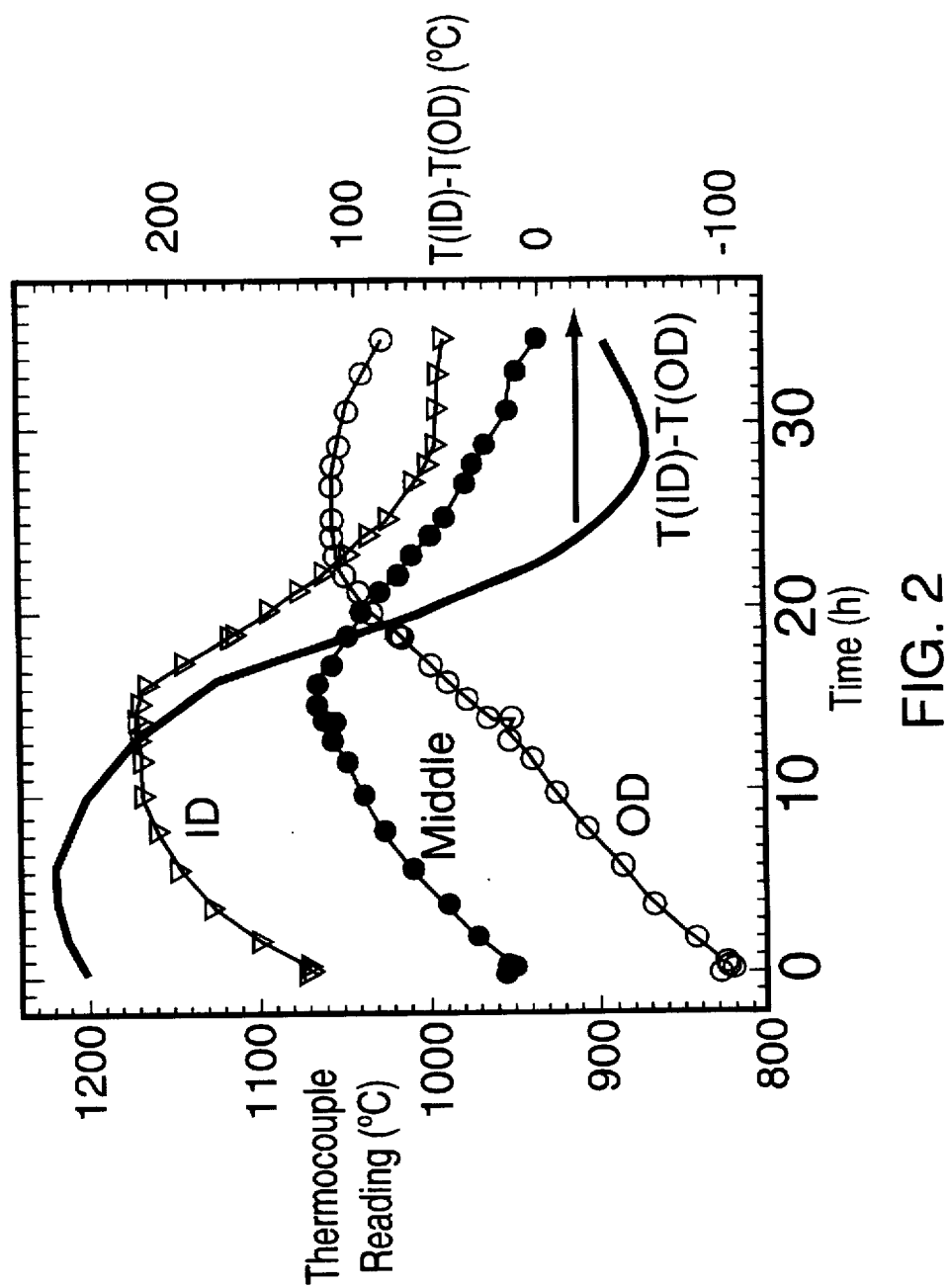
FIG. 2 is a temperature vs. time graph of a disk during the CVI process.
Figure 3:
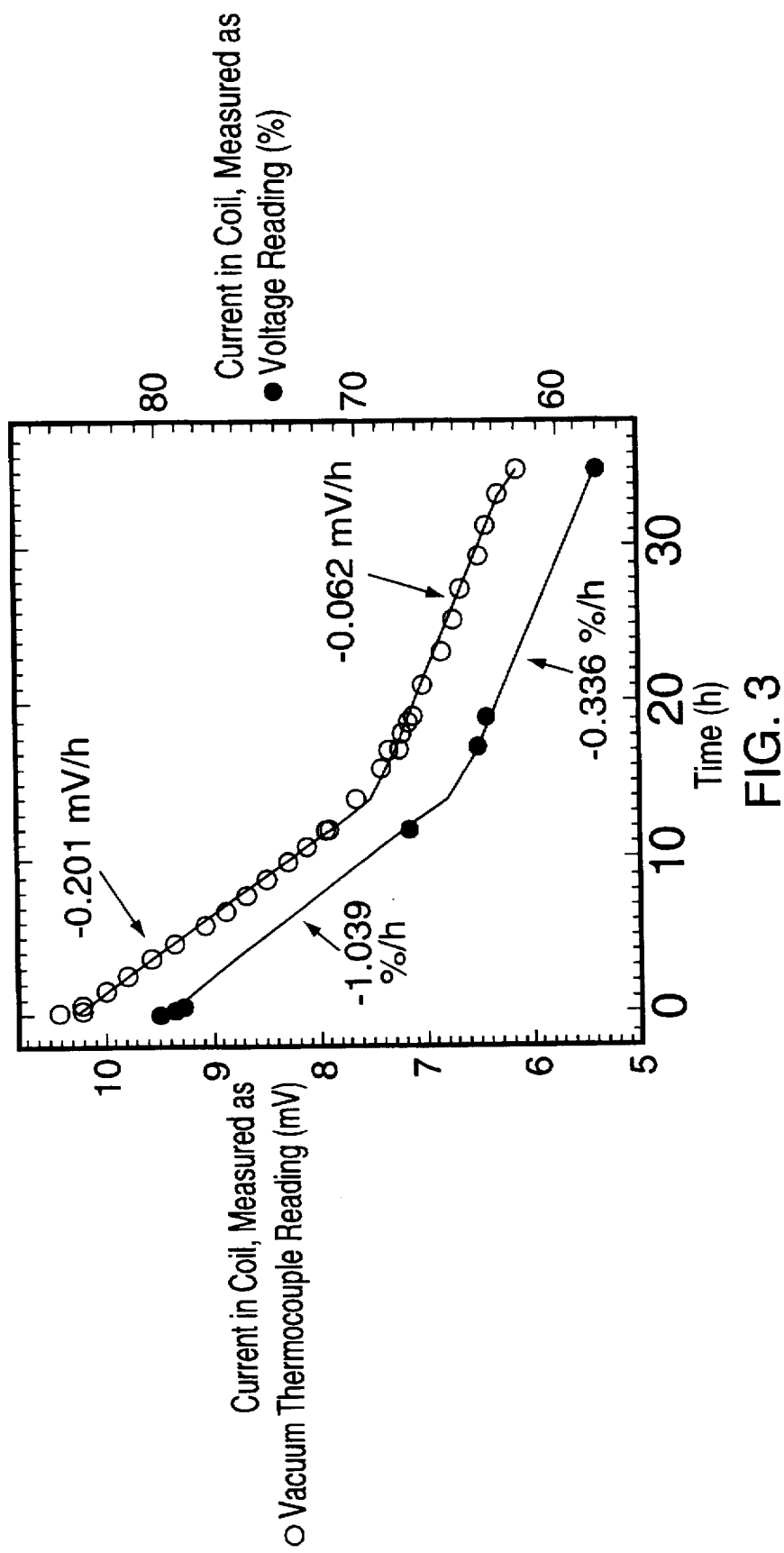
FIG. 3 is a coil current and coil voltage vs. time graph during the CVI process.

FIGS. 2 and 3 illustrate recorded results in the densification process of three disks. FIG. 2 illustrates the variation of temperature at three radial locations in the middle carbon-carbon substrate 4. FIG. 3 illustrates the time variation of the vacuum thermocouple, which represents the current in coil 2, and voltage across coil 2. Initially, the inner diameter (id) of substrate 4 is at the highest temperature. As the process continues, the temperature of the id, middle area and outside diameter (od) increase as a function of time, and the temperature difference between the id and od decreases as a function of time. Temperatures inside the disk reached about 1200° C., significantly higher than in isothermal CVI. The increase in the measured temperatures is due to the improved electrical coupling between substrate 4 and coil 2. That is, as more carbon is deposited within and on the disk, the disk exhibits higher electrical conductivity which results in more current flowing through substrate 4. Also, more of the current in substrate 4 flows closer to the outer diameter. As the pores inside substrate 4 become smaller and the surface starts to crust, the carbon deposition rate decreases, due to the much smaller density of nucleation sites or available surface area, and the temperature distribution throughout the disk becomes more uniform as shown in FIG. 2.

Referring to FIG. 3, the measured coil current or voltage applied to coil 2 decreases as a function of time at a constant rate; at about fourteen hours into the process, there is a noticeable break in the slope, and from that point on, the slope is about one-third its previous value. The time at which this break in the slope occurs correlates with the time when the id and middle temperatures peak. In this run, some surface crusting was noted and yellow vapors were observed in the chamber towards the end of the run. In other CVI runs, which were stopped closer to the slope breakpoint, no surface crusting occurred and no yellow vapors were observed in the chamber. In addition, the amount of liquid tar was significantly reduced in those runs terminated at the slope breakpoint, compared to runs which were continued well beyond the slope breakpoint.

Preferably, the coil current is measured during the densification process by means of a voltage across the vacuum thermocouple which is part of the induction power supply and known to those skilled in the art. The vacuum thermocouple output voltage decreases as a function of time only when electrically conductive carbon is added into and on the carbon disks, as shown in FIG. 3. The slope of the vacuum thermocouple as a function of time is a measure of the densification rate. For example we have demonstrated sensitivities of 0.1–0.3 gram carbon per µV when measured by the vacuum thermocouple. When surface crusting and substantial surface pore closure have begun, there is a significant decrease in the slope of the vacuum thermocouple voltage. As shown in FIG. 3, the slope of the measured current and voltage decreased by a factor of three at about fourteen hours. This decrease is correlated with saturation of the measured temperatures in different radial positions inside the disk.

Preferably, the process is operated in a "constant power" mode resulting in a continuous decrease in the measured coil current and coil voltage. Alternatively, the power can be controlled to operate as any desired time function of power vs. time ("variable power" mode). In the variable power mode, the variation of the slope of the measured electrical conductivity will be more complex with time; however, the instantaneous slope of the coil current or voltage will still indicate the instantaneous rate of densification.

An alternate voltage measurement technique is shown in FIG. 1. A voltmeter 30 measures the voltage across adjacent coil turns or alternatively, voltmeter 30a measures the voltage across a consecutive group of turns to more accurately and specifically indicate the rate of densification of individual substrates 4. That is, the coil turns electrically coupled with a particular substrate 4 will have a characteristic time/voltage relationship dependent upon the rate of densification of the individual substrate 4. This method allows for a more accurate determination of the process completion of individual substrates.

Figure 4:
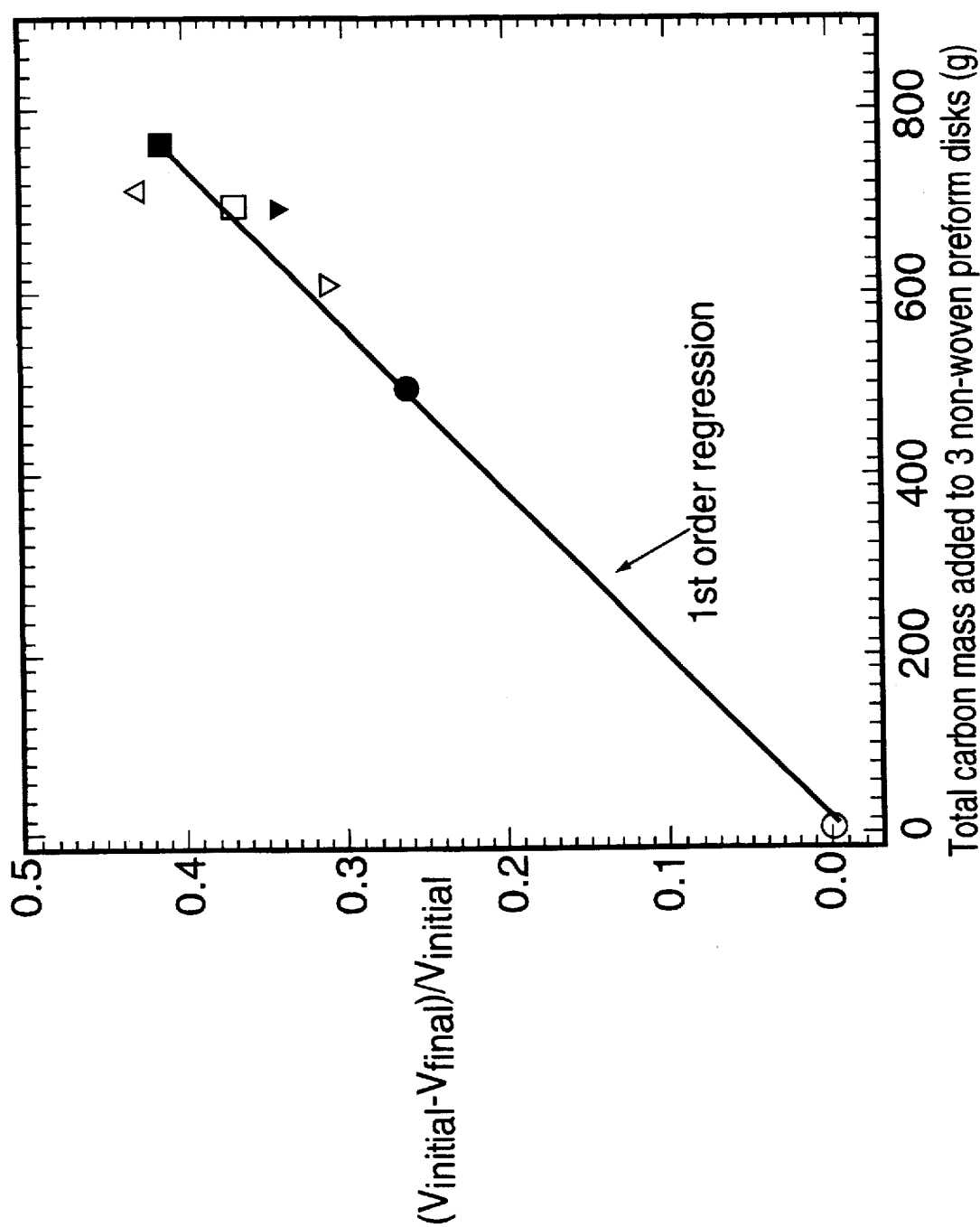
FIG. 4 is a graph of the relationship between the measured voltage and mass added to porous structures during multiple CVI process runs.

FIG. 4 illustrates the linear relationship between the relative change in vacuum thermocouple readings and the total carbon mass added to three disks in multiple thermal-gradient CVI carbon densification runs. The relative change in the vacuum thermocouple output is determined by the relationship:

$$(V_{initial} - V_{final})/V_{initial}$$

This linear function can be used as a calibration curve that makes it possible for predictive control of the densification rate of disks in real time. Accordingly, a preset mass limit or threshold value may be identified at the beginning of the process and monitored throughout the process by measuring the coil voltage. Once the desired threshold value is reached, as indicated by the voltage readings, the process is terminated.

In summary, the invention takes advantage of the realization that the coil current and voltage decrease as a function of time as electrically conductive carbon is deposited into and on the carbon disks. The slope of the coil current and voltage has been correlated to represent the densification rate. A significant decrease in the slope of the coil current and voltage vs. time has been realized to indicate that the densification process is nearing completion.

The invention may be used with many other materials which are sufficiently electrically conductive at the densification temperatures, for example, various metals and conductors (e.g. Al, TiN), semi-metals (e.g. B), semiconductors (e.g. SiC) and room-temperature insulators (e.g. $ZrO_2$). The densification conditions, such as temperature, power supply frequency, etc. are also given only as an example and are not intended to be limiting in any manner. Other temperature ranges, frequencies etc. can be used, depending on the specifics.

Furthermore, this method of measuring the densification rate is not limited to induction-heated parts or thermal-gradient infiltration processes. The same or slightly modified method can be applied to radiantly-heated parts and to isothermal processes. For example, a small sensing coil can be positioned at an appropriate distance from a part or parts which is or are being radiantly heated. The current or voltage in this sensing coil will depend on the electromagnetic coupling to the electrically conducting part(s) and therefore can be used to measure the electrical conductivity of the part(s) and thus the densification rate of the part(s). The part(s) can be a test specimen, specifically placed in the reactor for the purpose of measuring the densification rate, or it could be one of the specimens normally undergoing densification.

Another application of the invention includes measuring the etching rate of a conductive substrate or coating at any temperature. Examples include hydrogen etching or etching using suitable acids or bases. As would be known to those skilled in the art, the current and voltage versus time characteristics would be inverse those of the densification process.

Further applications include measuring the rate of chemical conversion of the substrate or coating, provided that the chemical conversion results in a measurable change in resistance. Examples of such chemical conversion processes are oxidation, nitridation and silicide formation. For example ammonia reacting with electrically conducting boron to form insulating boron nitride; oxygen reacting with carbon to form $CO_2$ gas; oxygen reacting with Si to form $SiO_2$; in all these cases, the conductivity would decrease. There are analogous situations where the conductivity would increase. Such processes have been called CVR (chemical vapor reactions), but they can be done also in a liquid, plasma or in other ways.

It will be understood that the particular embodiments described above are only illustrative of the principles of the present invention, and that various modifications could be made by those skilled in the art without departing from the scope and spirit of the present invention, which is limited only by the claims that follow.

We claim:

1. A method for determining a change from a first density to a second density of an electrically conductive porous solid structure comprising infiltrating said porous solid structure with a compound which upon decomposition forms an electrically conducting solid, decomposing said compound to form an electrically conducting solid within said porous structure and measuring a voltage or current communicated to the porous structure and the electrically conducting solid as a function of time during said infiltration and decomposition of said compound.

2. The method of claim 1 further comprising a step of terminating said change from a first density to a second density when said measured voltage or current as a function of time reaches a desired threshold value.

3. The method of claim 1 wherein the porous solid structure is porous carbon.

4. A method for determining a density change of an electrically conductive porous solid structure comprising providing an electrically conductive porous solid structure, electrically coupling said porous solid structure to an induction coil and heating said porous solid structure by providing said induction coil with an alternating current, thermally decomposing a compound to form an electrically conducting solid residue within said porous solid structure by chemical vapor infiltration, measuring the induction coil voltage or current during said decomposing of said compound and formation of said electrically conducting solid residue, calculating said voltage or current as a function of time, and terminating said decomposing of said compound and said formation of said electrically conducting solid residue when said calculated voltage or current as a function of time reaches a desired value.

5. The method of claim 4 wherein said induction coil comprises a plurality of turns and at least one turn is in a direct viewing relationship with said porous structure.

6. The method of claim 5 wherein said coil voltage is measured across two or more adjacent coil turns.

7. An improved method for densifying an electrically conductive porous solid structure by infiltration with a compound which upon thermal decomposition forms a conducting solid residue, and thermally decomposing said compound within the pores of said structure, the steps comprising:

a) establishing a thermal gradient within and across said porous structure consisting of a first volume having a first temperature greater than the temperature of a second volume;

b) infiltrating said porous solid structure with said thermally decomposable compound to affect deposition of electrically conducting solid residue within said porous solid structure predominantly at said first volume to form a densified zone; and c) progressively shifting said first temperature zone toward the second temperature zone as deposition of said solid residue proceeds, while maintaining the thermal gradient by subjecting the densified zone to electromagnetic radiation at a frequency which inductively couples to the densified zone of said porous solid structure;

wherein the improvement comprises d) measuring a voltage or current inductively coupled to said porous solid structure and said deposited electrically conducting solid residue during the steps b) and c);

e) calculating said measured voltage or current as a function of time; and f) terminating the densification process when said calculated voltage or current as a function of time reaches a threshold value.

8. The method of claim 7 wherein said porous solid structure is heated by an induction coil electrically connected to an alternating power supply.

9. The method of claim 8 wherein said voltage or current is measured by measuring the current flowing through or voltage across said induction coil.

10. The method of claim 7 wherein the improvement further comprises controlling the densification process as a function of said calculated voltage or current as a function of time.

* * * * *